United States Patent
Chen et al.

(10) Patent No.: US 8,269,350 B1
(45) Date of Patent: Sep. 18, 2012

(54) REDUCING THE SWITCHING NOISE ON SUBSTRATE WITH HIGH GROUNDING RESISTANCE

(75) Inventors: Chih-Chia Chen, Taipei (TW); Chao-Yang Yeh, Luzhou (TW); Meng-Lin Chung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/149,480

(22) Filed: May 31, 2011

(51) Int. Cl.
*H01L 23/52* (2006.01)
*H01L 23/48* (2006.01)
*H01L 29/40* (2006.01)
*H01L 23/485* (2006.01)

(52) U.S. Cl. .. 257/774; 257/734; 257/780; 257/E23.021

(58) Field of Classification Search .................. 257/734, 257/774, 780, E23.021
See application file for complete search history.

(56) References Cited

U.S. PATENT DOCUMENTS

| 7,112,883 | B2 * | 9/2006 | Hasunuma | 257/714 |
| 7,838,337 | B2 * | 11/2010 | Marimuthu et al. | 438/110 |
| 2006/0035510 | A1 * | 2/2006 | Numata et al. | 439/372 |
| 2006/0284670 | A1 | 12/2006 | Eid et al. | |
| 2011/0215470 | A1 * | 9/2011 | Chen et al. | 257/738 |

* cited by examiner

*Primary Examiner* — Luan C Thai
(74) *Attorney, Agent, or Firm* — Slater & Matsil, L.L.P.

(57) ABSTRACT

An interconnection component includes a plurality of through-substrate vias (TSVs) penetrating through a substrate. The plurality of TSVs includes an active TSV having a first end and a second end. The first end of the active TSV is electrically coupled to a signal-providing circuit. The second end of the active TSV is electrically coupled to an additional package component bonded to the interconnection component. The plurality of TSVs further includes a dummy TSV having a first end and a second end, wherein the first end is electrically coupled to the signal-providing circuit, and wherein the second end is open ended.

20 Claims, 2 Drawing Sheets

REDUCING THE SWITCHING NOISE ON SUBSTRATE WITH HIGH GROUNDING RESISTANCE

BACKGROUND

In three-dimensional integrated circuits, a device die may be stacked on another device die, or stacked on an interposer, a package substrate, and the like. Through-substrate vias (TSVs) are used to make electrical connections from one side of, for example, an interposer to the opposite side. An interposer may include many TSVs therein.

Increasingly more interposers are formed in semiconductor substrates such as silicon substrates. During the use of the interposers, the respective semiconductor substrates may be electrically grounded or may be electrically floating. Each of the TSVs is separated from the respective semiconductor substrate by an insulation layer. Accordingly, a TSV forms a capacitor with the insulation layer and the substrate, with the TSV and the substrate acting as two capacitor plates, and the insulator acting as the capacitor insulating layer. When the substrate is electrically floating or has an imperfect grounding, signals in TSVs are coupled to the semiconductor substrate, and are further coupled to other TSVs. Each of the TSVs thus acts as a noise source for other TSVs.

Some of the signals that are transferred through the TSVs might be more prone to the effect of the noise from other TSVs. For example, analog signals and weak digital signals are more likely to be affected. Such adverse effect needs to be reduced.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for reducing the noise from through-substrate vias (TSVs) and the respective package structures are provided in accordance with an embodiment. The variations and the operation of the embodiment are then discussed. Throughout the various views and illustrative embodiments, like reference numbers are used to designate like elements.

Figure 1:
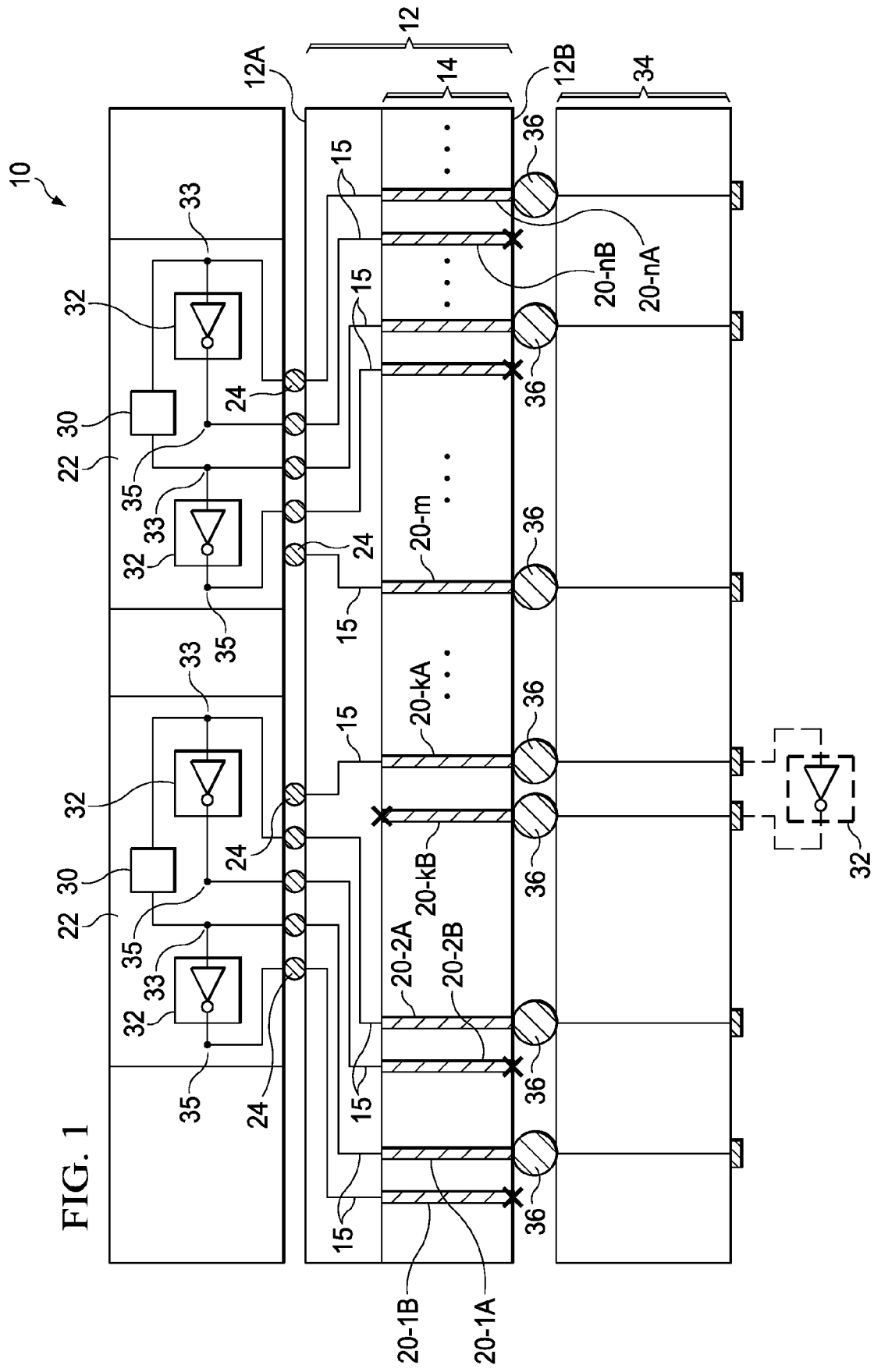
FIG. 1 illustrates a cross-sectional view of a package structure including an interposer, wherein active through-substrate vias (TSVs) and dummy TSVs are formed in the interposer to neutralize noise.

FIG. 1 illustrates a cross-sectional view of package structure 10 in accordance with an embodiment. Package structure 10 includes interconnection component 12, which is configured to make electrical connections from major surface 12A to major surface 12B, with major surfaces 12A and 12B being opposite surfaces of interconnection component 12. In an embodiment, interconnection component 12 is an interposer, and hence is alternatively referred to as interposer 12 hereinafter, although it may also be another type of interconnection component such as a package substrate. Interposer 12 includes substrate 14, which may be formed of a semiconductor material such as silicon, although other commonly used semiconductor materials may also be used. Alternatively, substrate 14 is formed of a conductive material or a dielectric material. Substrate 14 may be electrically floating or electrically grounded. It is observed, however, that substrate 14 may have an imperfect grounding with a high resistance to the electrical ground.

TSVs 20 (including 20-1A/20-1B through 20-nA/20-nB) are formed in substrate 14, and penetrate from one side to the opposite side of substrate 14. Metal connections may be formed to electrically couple TSVs 20 to device dies 22, which are bonded to interposer 12 through, for example, solder bumps 24.

At least some, and possibly all, of TSVs 20 are grouped as pairs. Throughout the description, the TSVs in the same TSV pair are denoted using same reference numerals, with one TSV in the pair post-suffixed with letter "A," and the other TSV in the same pair post-suffixed with letter "B." The TSVs post-suffixed with letter "A" are active TSVs that conduct signals from device dies 22 to package component 34. The TSVs post-suffixed with letter "B" are dummy TSVs that are used for neutralizing the noise generated by the respective active TSVs in the same TSV pair. The dummy TSVs are open ended at the side of interposer 12 facing package component 34, wherein the open end is symbolized by the marks "x." For example, TSVs 20-1A and 20-1B form a TSV pair, wherein TSV 20-1A is used for transferring signal from device die 22 to package component 34, which signal may further be conducted through package component 34 in some embodiments. TSV 20-1B, on the other hand, is used to neutralize the noise generated by TSV 20-1A, and the signals carried by dummy TSV 20-1B may not be conducted into package component 34. In an embodiment, some of the TSVs 20 such as TSV 20-m are not formed as pairs, and these TSVs 20 don't have corresponding dummy TSVs for neutralizing the noise generated by them.

Device dies 22 may include input/output (I/O) circuits that output signals to TSVs 20. For example, IO circuits 30 output signals to TSVs 20-1A, 20-2A, and 20-m. Complementary signal generation circuit(s) 32 are used to generate complementary signals for the signals that are to be outputted to active TSVs 20-1A, 20-2A, and the like. The resulting complementary signals are provided to the respective dummy TSVs 20-1B, 20-2B, and the like, in the same TSV pair. Therefore, each of active TSVs 20-1A, 20-2A and the like is coupled to, and receives signal from, a first one of input node 33 and output node 35 of a respective complementary signal generation circuit 32, and the respective dummy TSVs 20-1B, 20-2B, and the like are electrically coupled to, and receive the complementary signals from, a second one of input node 33 and output node 35.

In an embodiment, complementary signal generation circuits 32 generate complementary signals by inverting logic high signals to logic low signals, and inverting logic low signals to logic high signals. In an exemplary embodiment, the signals on each of active TSVs 20 may be inverted independent from the signals on other active TSVs 20. For example, assuming the signals on TSV 20-1A switches between 0V and 1V, then one of complementary signal generation circuit 32 inverts 0V signals as 1V signals, and 1V signals as 0V signals, and provides the inverted signals to TSV 20-1B. In the meanwhile, if the signals on TSV 20-2A switches between 0V and 2V, then one of complementary signal generation circuits 32 inverts 0V signals as 2V signals, and 2V signals as 0V signals, and provides the inverted signal to TSV 20-2B. If a signal on TSV 20-nA switches between 0V and −1V, then complementary signal generation circuits 32 may invert 0V signals as −1V signals, and −1V signals as 0V signals, and provides the inverted signal to TSV 20-nB. Exemplary complementary signal generation circuits 32 may include inverters, as illustrated in FIG. 1.

In an embodiment, active TSVs 20-1A, 20-2A, 20-nA, and the like are further electrically coupled to package component 34 underlying interposer 12, through, for example, solder balls 36. The signals on active TSVs 20 may be coupled penetrating through package component 34, for example, if package component 34 is a package substrate. Alternatively, the signals on active TSVs 20 may be coupled into, but not penetrating through, package component 34 if package component 34 is a device die. Accordingly, both ends of each of active TSVs 20 are connected, and are not open-ended. On the other hand, each of dummy TSVs 20-1B, 20-2B . . . 20-nB may have one end that is not opened, and is connected to device dies 22, for example, and another end that is open ended. For example, as shown in FIG. 1, Dummy TSVs 20-1B through 20-nB are not connected to other conductive features at the side of surface 12B of interposer 12. In an embodiment, being open ended, dummy TSVs 20-1B through 20-nB are not in physical contact with any bond pads and any solder balls. In other embodiments, being open ended, dummy TSVs 20-1B through 20-nB physically contact bond pads (not shown), while the bonding pads do not have solder balls connecting them to package component 34. In yet other embodiments, being open ended, dummy TSVs 20-1B through 20-nB physically contact bond pads, which are also electrically coupled to solder balls (not shown) located between interposer 12 and package component 34. However, dummy TSVs 20-1B through 20-nB are not electrically coupled to electrical connections leading into package component 34. Accordingly, when package 10 is under normal operation when powered up, no currents flow through dummy TSVs 20-1B through 20-nB.

Figure 2:
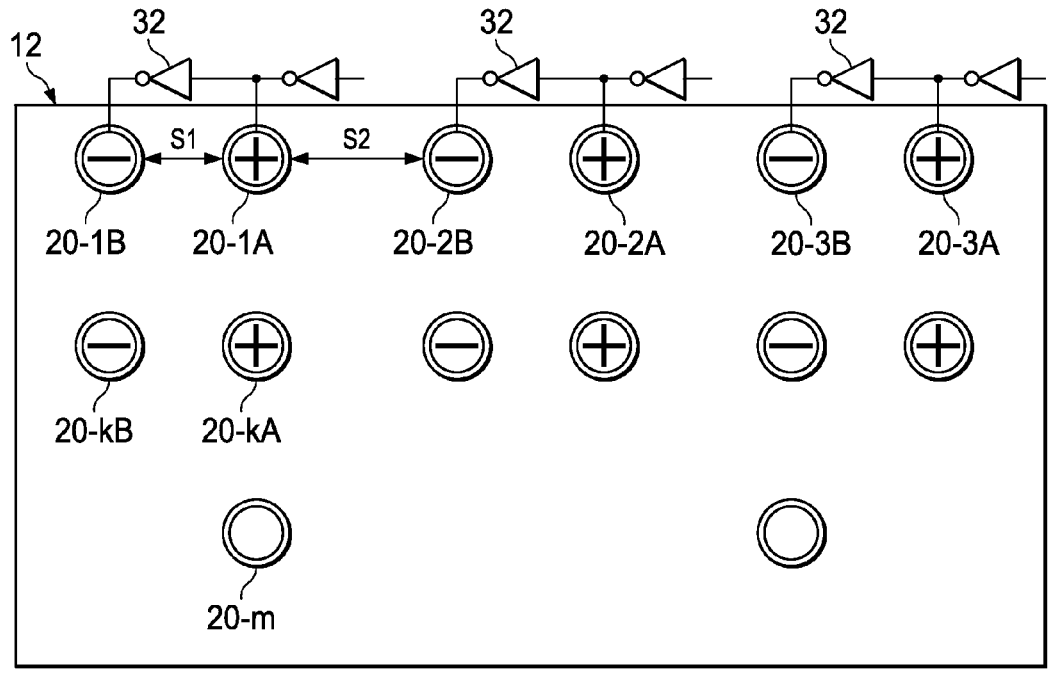
FIG. 2 illustrates a top view of an exemplary interposer comprising active TSVs and dummy TSVs formed as TSV pairs, with complementary signals provided to the active TSV and the dummy TSV in the same TSV pair.

FIG. 2 illustrates a top view of interposer 12. In an embodiment, the active TSV and the dummy TSV in the same TSV pair are located close to each other, with no other TSV(s) physically located therebetween. Furthermore, the active TSV and the dummy TSV in the same TSV pair may be located closely, with spacing S1 between the two TSVs being the minimum spacing that can be achieved by the forming technology. Inter-pair spacings S2 between different TSV pairs may be equal to or greater than spacing S1.

Figure 3:
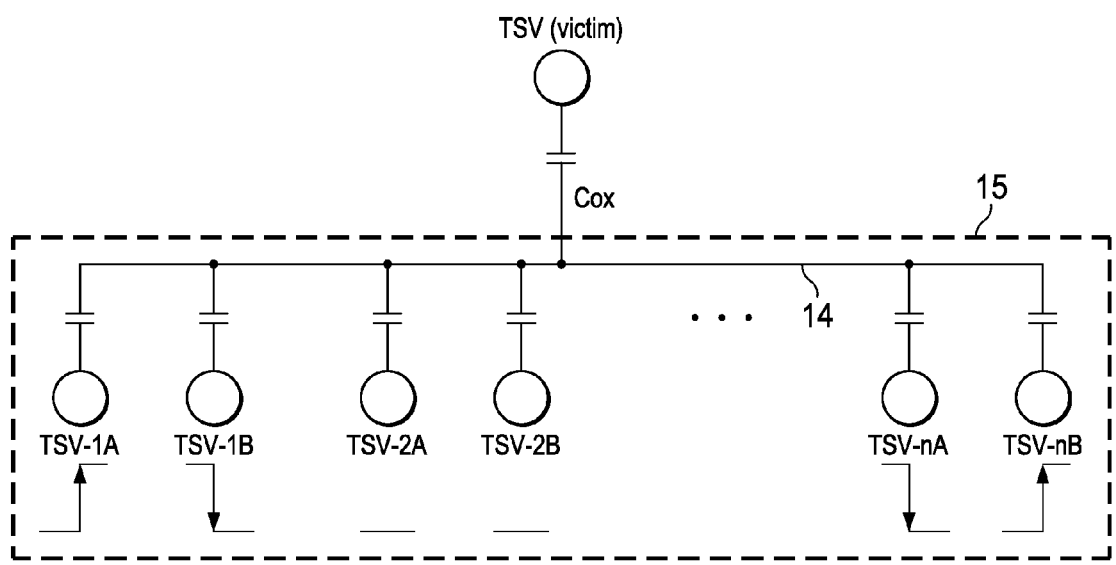
FIG. 3 illustrates an equivalent circuit diagram of an interposer.

By adding dummy TSVs that carry signals complementary to the signals of the respective TSVs in the same TSV pair, the noise coupled to substrate 14 (FIG. 1) by an active TSV is neutralized by the noise coupled to substrate 14 from the respective dummy TSV. The TSVs in interposer 12 are thus subject to a smaller noise from other TSVs. It is realized that all TSVs 20 in interposer 12 may act as aggressors that generate noise to other TSVs, and all TSVs 20 are also victims of the noise generated by other TSVs. FIG. 3 illustrates an equivalent circuit diagram wherein a TSV (a victim), which may be any of the TSVs 20 in interposer 12, is coupled to substrate 14 through capacitor Cox. The remaining TSVs (including all other TSV-1A, TSV-1B, through TSV-nA and TSV-nB, except the victim itself), which are illustrated as being in dashed box 15, are also coupled to substrate 14. The inverted signals carried by the TSVs are also schematically illustrated. Observing the equivalent circuit in FIG. 3, Equation 1 may be formed:

$$V_{victim} = \{(V_{TSV-1A} + V_{TSV-1B}) + (V_{TSV-2A} + V_{TSV-2B}) + \ldots (V_{TSV-nA} + V_{TSV-nB})\}/N = 0 \quad [\text{Eq. 1}]$$

Wherein number N is the total number of other TSVs (including dummy TSVs and active TSVs) generating noises to the victim, and notations $V_{TSV-1A}$, $V_{TSV-1B}$, $V_{TSV-2A}$, $V_{TSV-2A}$, etc., represent the voltage levels of all other TSVs except the victim, wherein the voltage levels are also related to the noise levels. It is observed that the noises in the same TSV pairs cancel each other since they have inverted phases. For example, $V_{TSV-1A}$ and $V_{TSV-1B}$ cancel each other, and $V_{TSV-2A}$ and $V_{TSV-2B}$ cancel each other. The resulting noise level $V_{victim}$ that is coupled to the victim TSV is thus significantly reduced.

Since dummy TSVs need to be added in order to reduce the noise level, extra interposer area is needed to form the dummy TSVs. To reduce the amount of the extra interposer area used by the dummy TSVs, the noise level generated by each of TSVs may be analyzed, and the dummy TSVs are added for strong aggressors generating high levels of noises, but not added for weak aggressors generating low levels of noises. In an embodiment, the dummy TSVs are added for the TSVs 20 generating noises having noise levels higher than a pre-determined noise level, while no dummy TSVs are added for the TSVs generating noises with noise levels lower than the pre-determined noise level. For example, there is no need to add dummy TSVs for TSVs that are electrically grounded. The TSVs carrying fast-switching signals and/or signals with great magnitudes may generate high noises, and hence dummy TSVs may be added to carry complementary signals for these TSVs. On the other hand, the TSVs carrying slow-switching signals and/or signals with small magnitudes may generate low noises, and hence dummy TSVs do not need to be added. For example, in FIG. 1, TSV 20-m does not have a respective dummy TSV added.

Referring to FIG. 1 again, it is observed that signals may be transferred from device dies 22 to package component 34, or from package component 34 to device dies 22. Accordingly, for the TSVs 20 that carry signals transferred in the direction from package component 34 to device dies 22, dummy TSVs (such as TSV 20-kB) may be added for the respective active TSVs (such as TSV 20-kA), with the dummy TSVs and the respective signal-carrying TSVs in the same TSV pair carrying complementary signals. Accordingly, TSV 20-kB is electrically coupled at the bottom end (at surface 12B of interposer 12), for example, to complementary signal generation circuit 32. TSV 20-kB is open ended at the top end and disconnected from other conductive components on the top end (at surface 12A of interposer 12).

By using the embodiments, the noise generated from the TSVs in interposers may be neutralized, and the overall noise received by the TSVs is significantly reduced, especially for floating substrates or imperfectly grounded conductive or semiconductor substrates.

In accordance with embodiments, an interconnection component includes a plurality of TSVs penetrating through a substrate. The plurality of TSVs includes an active TSV having a first end and a second end. The first end of the active TSV is electrically coupled to a signal-providing circuit. The second end of the active TSV is electrically coupled to an additional package component bonded to the interconnection component. The plurality of TSVs further includes a dummy TSV having a first end and a second end, wherein the first end is electrically coupled to the signal-providing circuit, and wherein the second end is open ended.

In accordance with other embodiments, a circuit structure includes a complementary signal generation circuit, which further includes an input and an output. The complementary signal generation circuit is configured to receive a first signal into the input and generate a second signal to the output, wherein the first and the second signals are complementary signals. The circuit structure further includes an interconnection component including a substrate, which is at least semi-conductive, and a plurality of TSVs penetrating through the substrate. The plurality of TSVs includes a TSV pair that includes an active TSV and a dummy TSV. The active TSV is coupled to, and receives a first signal from, a first one of the input and the output of the complementary signal generation circuit. The dummy TSV has a first end and a second end, wherein the first end is configured to receive the second signal from a second one of the input and the output of the complementary signal generation circuit, and the second end is open ended.

In accordance with yet other embodiments, a circuit structure includes a device die configured to generate a second signal from a first signal, wherein the first and the second signals are complementary signals. The circuit structure further includes an interposer having a first side bonded to the device die. The interposer is configured to conduct the first signal through a first TSV of a TSV pair in the interposer, wherein the first signal is conducted to a package component bonded to a second side of the interposer. The interposer is further configured to conduct the second signal to a first end of a second TSV of the TSV pair, wherein the circuit structure is configured not to conduct the second signal on the second TSV to any package component bonded to the second side of the interposer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit structure comprising:
    an interconnection component comprising:
        a substrate; and
        a plurality of through-substrate vias (TSVs) penetrating through the substrate, wherein the plurality of TSVs comprises:
            an active TSV comprising a first end and a second end, wherein the first end of the active TSV is electrically coupled to a signal-providing circuit, and wherein the second end is electrically coupled to an additional package component bonded to the interconnection component; and
            a dummy TSV comprising a first end and a second end, wherein the first end is electrically coupled to the signal-providing circuit, and wherein the second end is open ended.

2. The circuit structure of claim 1, wherein the active TSV and the dummy TSV are configured to receive complementary signals generated in the circuit structure.

3. The circuit structure of claim 2 further comprising a die bonded to the interconnection component, wherein the die comprises a complementary signal generation circuit comprising an input node electrically coupled to, and provides an input signal to, a first one of the active TSV and the dummy TSV, and an output node electrically coupled to, and provides an output signal to, a second one of the active TSV and the dummy TSV.

4. The circuit structure of claim 2, wherein the complementary signals provided to the active TSV and the dummy TSV are generated by an inverter.

5. The circuit structure of claim 1, wherein the active TSV and the dummy TSV are physically located closely, with no additional TSV physically located between the active TSV and the dummy TSV.

6. The circuit structure of claim 1, wherein the plurality of TSVs comprises a plurality of TSV pairs, with each pair comprising a first and a second TSV, with no additional TSVs located between the first and the second TSVs, and wherein the first TSV is an active TSV, and the second TSV is a dummy TSV with a first end being electrically connected, and a second end being open ended.

7. The circuit structure of claim 6, wherein the plurality of TSV pairs comprises a first TSV pair and a second TSV pair, wherein the first TSV pair comprises a first dummy TSV with an open end, and the second TSV pair comprises a second dummy TSV with an open end, and wherein the open end of the first dummy TSV and the open end of the second dummy TSV are on opposite sides of the substrate.

8. The circuit structure of claim 1, wherein the substrate is a semiconductor substrate.

9. A circuit structure comprising:
    a complementary signal generation circuit comprising an input and an output, wherein the complementary signal generation circuit is configured to receive a first signal into the input and generate a second signal to the output, and wherein the first and the second signals are complementary signals; and
    an interconnection component comprising:
        a substrate, wherein the substrate is at least semi-conductive; and
        a plurality of through-substrate vias (TSVs) penetrating through the substrate, wherein the plurality of TSVs comprises a TSV pair comprising:
            an active TSV coupled to, and receives a first signal from, a first one of the input and the output of the complementary signal generation circuit; and
            a dummy TSV comprising a first end and a second end, wherein the first end is configured to receive the second signal from a second one of the input and the output of the complementary signal generation circuit, and wherein the second end is open ended.

10. The circuit structure of claim 9 further comprising a package component bonded to the interconnection component, wherein the second end of the dummy TSV is physically located between the first end of the dummy TSV and the package component, and wherein the dummy TSV is not electrically connected to any metal feature in the package component.

11. The circuit structure of claim 9 further comprising a plurality of TSV pairs penetrating through the substrate, wherein each of the plurality of TSV pairs comprises an active TSV and a dummy TSV, with the active TSV and the dummy TSV in each of the plurality of TSV pairs receiving signals complementary to each other.

12. The circuit structure of claim 11, wherein substantially no TSV is physically located between the active TSV and the dummy TSV, and wherein the active TSV and the dummy TSV are in a same one of the plurality of TSV pairs.

13. The circuit structure of claim 9 further comprising an additional TSV in the substrate, wherein no TSV in the interconnection component carrying signals complementary to signals of the additional TSV is located adjacent to the additional TSV.

14. The circuit structure of claim 9 further comprising a device die bonded to the interconnection component, wherein the complementary signal generation circuit is located in the device die.

15. A circuit structure comprising:
a device die configured to generate a second signal from a first signal, wherein the first and the second signals are complementary signals; and
an interposer with a first side bonded to the device die, wherein the interposer is configured to:
conduct the first signal through a first through-substrate via (TSV) of a TSV pair in the interposer, wherein the first signal is conducted to a package component bonded to a second side of the interposer; and
conduct the second signal to a first end of a second TSV of the TSV pair, wherein the circuit structure is configured not to conduct the second signal on the second TSV to any package component bonded to the second side of the interposer.

16. The circuit structure of claim 15 further comprising an additional package component bonded to the second side of the interposer, wherein the interposer comprises a plurality of TSV pairs therein, and wherein each of the plurality of TSV pairs comprises:
an active TSV configured to conduct a third signal through the interposer and to the additional package component; and
a dummy TSV configured to conduct a fourth signal through the interposer, wherein the third and the fourth signals are complementary to each other, and wherein the dummy TSV is open ended on the second side of the interposer.

17. The circuit structure of claim 15 further comprising a plurality of TSVs, with each of the plurality of TSVs not having a respective dummy TSV carrying a complementary signal of a signal on the each of the plurality of TSVs, wherein a noise generated by each of the plurality of TSVs has a lower noise level than a noise generated by the first TSV.

18. The circuit structure of claim 15, wherein the interposer comprises a silicon substrate, and wherein the active TSV and the dummy TSV penetrate through the silicon substrate.

19. The circuit structure of claim 15, wherein no additional TSV is physically located between the first and the second TSVs.

20. The circuit structure of claim 15, wherein a second end of the first TSV is bonded with a solder ball, and a second end of the second TSV is not bonded with any solder bump.

* * * * *